(12) United States Patent
Loy et al.

(10) Patent No.: US 7,821,776 B2
(45) Date of Patent: Oct. 26, 2010

(54) TAMPER RESISTANT METER ASSEMBLY

(75) Inventors: Garry M. Loy, Raleigh, NC (US); Rodney C. Hemminger, Raleigh, NC (US)

(73) Assignee: Elster Electricity, LLC, Raleigh, NC (US)

(*) Notice: Subject to any disclaimer, the term of this patent is extended or adjusted under 35 U.S.C. 154(b) by 23 days.

(21) Appl. No.: 12/410,858

(22) Filed: Mar. 25, 2009

(65) Prior Publication Data
US 2009/0244818 A1 Oct. 1, 2009

Related U.S. Application Data

(60) Provisional application No. 61/039,258, filed on Mar. 25, 2008, provisional application No. 61/042,339, filed on Apr. 4, 2008.

(51) Int. Cl.
*G01R 11/32* (2006.01)
(52) U.S. Cl. .................. 361/667; 361/664; 361/666; 174/66; 174/67; 324/107; 324/115; 324/141; 324/156
(58) Field of Classification Search .............. 361/654, 361/659, 664–670; 324/110, 107, 115, 96, 324/141, 142, 155–157; 174/66, 67; 220/3.8, 220/298, 302; 702/6, 61, 57, 164
See application file for complete search history.

(56) References Cited

U.S. PATENT DOCUMENTS

| | | | | |
|---|---|---|---|---|
| 2,106,950 A | * | 2/1938 | Holtz | 361/672 |
| 2,313,881 A | * | 3/1943 | Lewis | 220/302 |
| 2,895,637 A | * | 7/1959 | Bakke et al. | 220/302 |
| 3,590,376 A | * | 6/1971 | Mindt et al. | 324/156 |
| 3,628,096 A | | 12/1971 | Drew, Jr. | |
| 3,846,677 A | * | 11/1974 | Keever et al. | 361/659 |
| 3,928,788 A | * | 12/1975 | Finnen et al. | 361/664 |
| 3,943,441 A | * | 3/1976 | Shackford | 324/110 |
| 4,110,814 A | | 8/1978 | Britton et al. | |
| 4,813,882 A | * | 3/1989 | Ruiz | 439/101 |
| 5,088,004 A | | 2/1992 | Howell | |
| 5,098,311 A | | 3/1992 | Roath et al. | |
| 5,364,290 A | * | 11/1994 | Hartman | 439/517 |
| 5,473,504 A | | 12/1995 | Horan et al. | |
| 6,617,978 B2 | | 9/2003 | Ridenour et al. | |
| 6,679,723 B1 | * | 1/2004 | Robinson | 439/483 |
| 6,734,663 B2 | | 5/2004 | Fye et al. | |
| 6,737,855 B2 | | 5/2004 | Huber et al. | |
| 6,823,563 B2 | * | 11/2004 | Robinson et al. | 16/422 |
| 6,983,211 B2 | * | 1/2006 | Macfarlene et al. | 702/61 |
| 7,019,666 B2 | * | 3/2006 | Tootoonian Mashhad et al. | 340/870.02 |
| 7,274,187 B2 | | 9/2007 | Loy | |
| 2003/0025493 A1 | | 2/2003 | Fye et al. | |

* cited by examiner

*Primary Examiner*—Michael V Datskovskiy
(74) *Attorney, Agent, or Firm*—Woodcock Washburn LLP

(57) ABSTRACT

An electrical meter is provided that includes a cover configured for securement onto a base. The meter includes features that resist meter tampering, and features that provide evidence of meter tampering.

19 Claims, 12 Drawing Sheets

TAMPER RESISTANT METER ASSEMBLY

CROSS REFERENCE TO RELATED APPLICATIONS

This application claims the benefit of U.S. patent application Ser. No. 61/039,258, filed on Mar. 25, 2008, and further claims the benefit of U.S. patent application Ser. No. 61/042,339, filed on Apr. 4, 2008, the disclosure of each of which is hereby incorporated by reference as if set forth in its entirety herein.

BACKGROUND

The embodiments described herein relate generally to electrical energy meters, and in particular to a meter having a tamper-resistant or tamper-evident cover.

Electrical energy meters, also referred to as "watt-hour meters," are used on a widespread basis in residential, commercial, and industrial applications to measure the amounts of utility, such as electricity, gas, and the like, that are being utilized by customers. Meters are typically mounted on an exterior or interior wall of a building being monitored, and generally include a base and a cover attached to the base. The base supports a rate metering device attached to a power box, and a utility usage display. The cover can be substantially clear or include a clear portion that allows the usage display to be viewed through the cover.

Referring to FIGS. 1 and 2, a conventionally constructed meter 20 is schematically illustrated as including a base 22 having a mounting location 24 that supports the rate metering device (not shown), and a cover 26 attached to the base 22. The base 22 includes an outer lip 31 that defines the perimeter of the cover 26, and is sized to fit over the perimeter of the base 22. The base 22 further includes a plurality of circumferentially spaced retention lugs 30 that extend radially in from the lip 31. Each retention lug 30 can define a retention pocket 32 configured to receive a complementary plurality of locking members 33 that are circumferentially spaced about the perimeter of the base 22. A stop plate 34 is disposed at one end of the locking member 33 on the base 22. The meter 20 can thus be assembled by fitting the cover 26 over the base 22 such that the retention pockets 32 are aligned with the locking members 33.

The cover 26 can then be rotated in a direction (Arrow A as illustrated) that causes the retention pockets 32 to receive the complementary locking members 33. Engagement between the stop plates 34 and the retention lugs 30 prevent over-rotation of the cover 26. The locking members 33 can have a thickness that causes a pressure-fit with the retention lugs 30 inside the pockets 32 that resists but does not prevent counter-rotation (in the direction of Arrow B) that detaches the cover 26 from the base 22.

It has been a goal of conventional energy meter design to provide tamper resistant meters. Meter covers were historically made from glass to provide transparency that enabled viewing of usage display. Unfortunately, the glass covers were subject to breakage by vandals. The development of impact resistant plastic such as polycarbonate allowed for plastic covers to replace the conventional glass covers to greatly reduce vandalism. Covers can further be provided with a seal that is installed between the meter base and the cover to substantially prevent relative rotation, thereby substantially preventing tampering due to rotational detachment of the cover from the base. Unfortunately, conventional electrical meters were subject to tampering by prying the meter cover off of the base. Because the conventional meter cover could subsequently be fitted over the base into its original configuration, the indications (if any) would be sparse that the meter had been tampered with.

It is therefore desired to provide an electrical meter that has a reduced exposure to tampering, or is tamper evident.

SUMMARY

In accordance with one embodiment, an electrical meter cover is provided that is configured to be mounted onto an electrical meter base of the type defining a substantially cylindrical body, and a locking member carried by the cylindrical body. The electrical meter cover body includes a substantially cylindrical cover body defining an axially outer closed end, and an opposing axially inner open end. The meter cover body further includes a radial flange defining a radially inner end connected to the open and of the cover body, and an opposing radially outer end. A lip extends axially inward from the radially outer end of the flange. A retention lug defines a retention pocket that is configured to receive the locking member of the meter cover to secure the meter cover onto the meter base. The pocket defines a proximal insertion end and an opposing distal end. A retention rib is disposed outside the pocket and juxtaposed with the distal end of the pocket so as to limit access to the pocket once the meter cover has been secured onto the meter base.

BRIEF DESCRIPTION OF THE DRAWINGS

The embodiments described below will be better understood, and its numerous objects and advantages will become apparent to those skilled in the art by reference to the following detailed description when taken in conjunction with the following drawings, in which.

DETAILED DESCRIPTION OF ILLUSTRATIVE EMBODIMENTS

Figure 3:
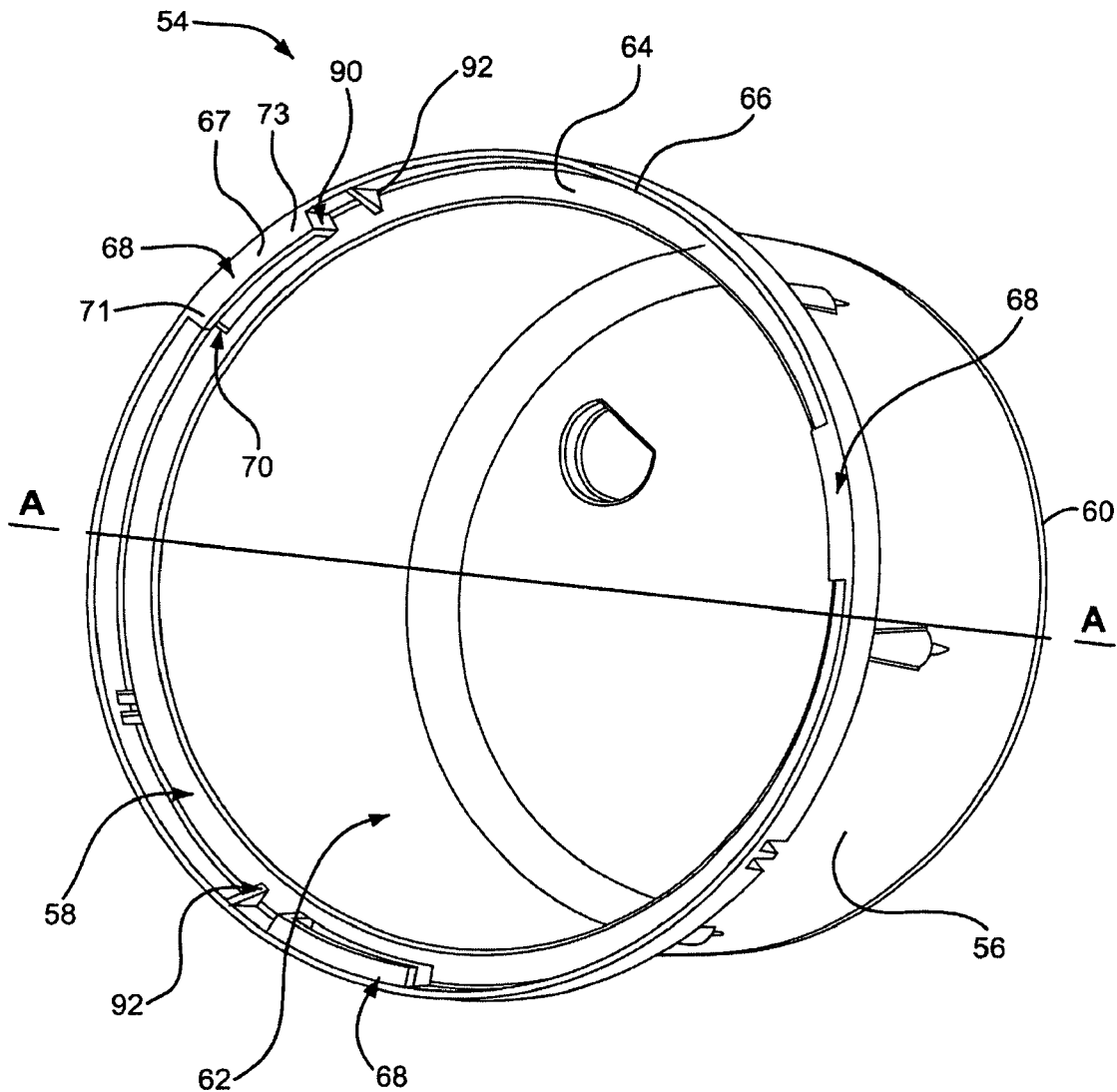
FIG. 3 is a rear perspective view of a cover constructed in accordance with one embodiment.
Figure 4:
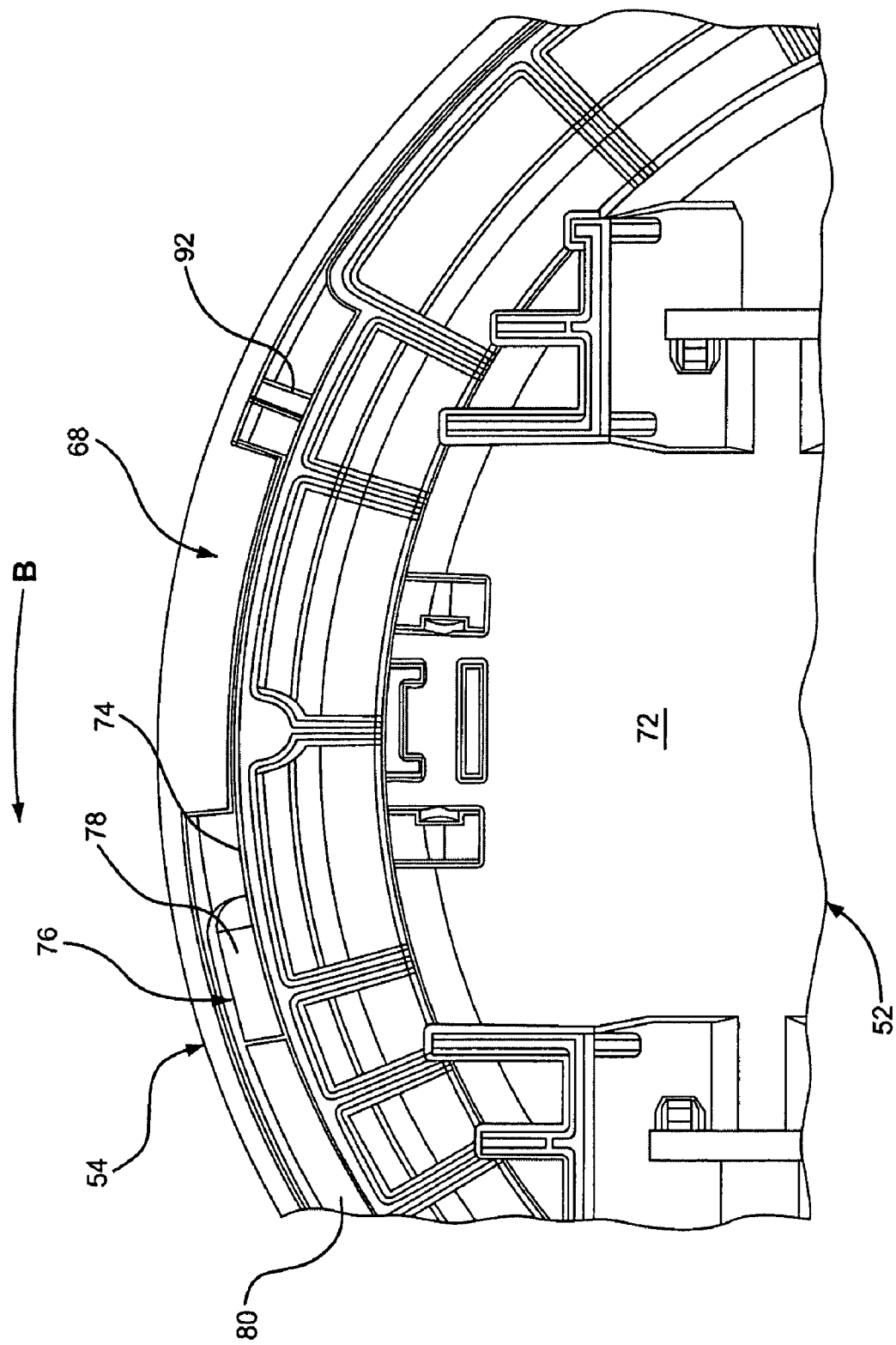
FIG. 4 is a bottom plan view of an electrical meter assembly including a portion of the base and the cover illustrated in FIG. 3, wherein the base is aligned with the cover for installation.
Figure 5:
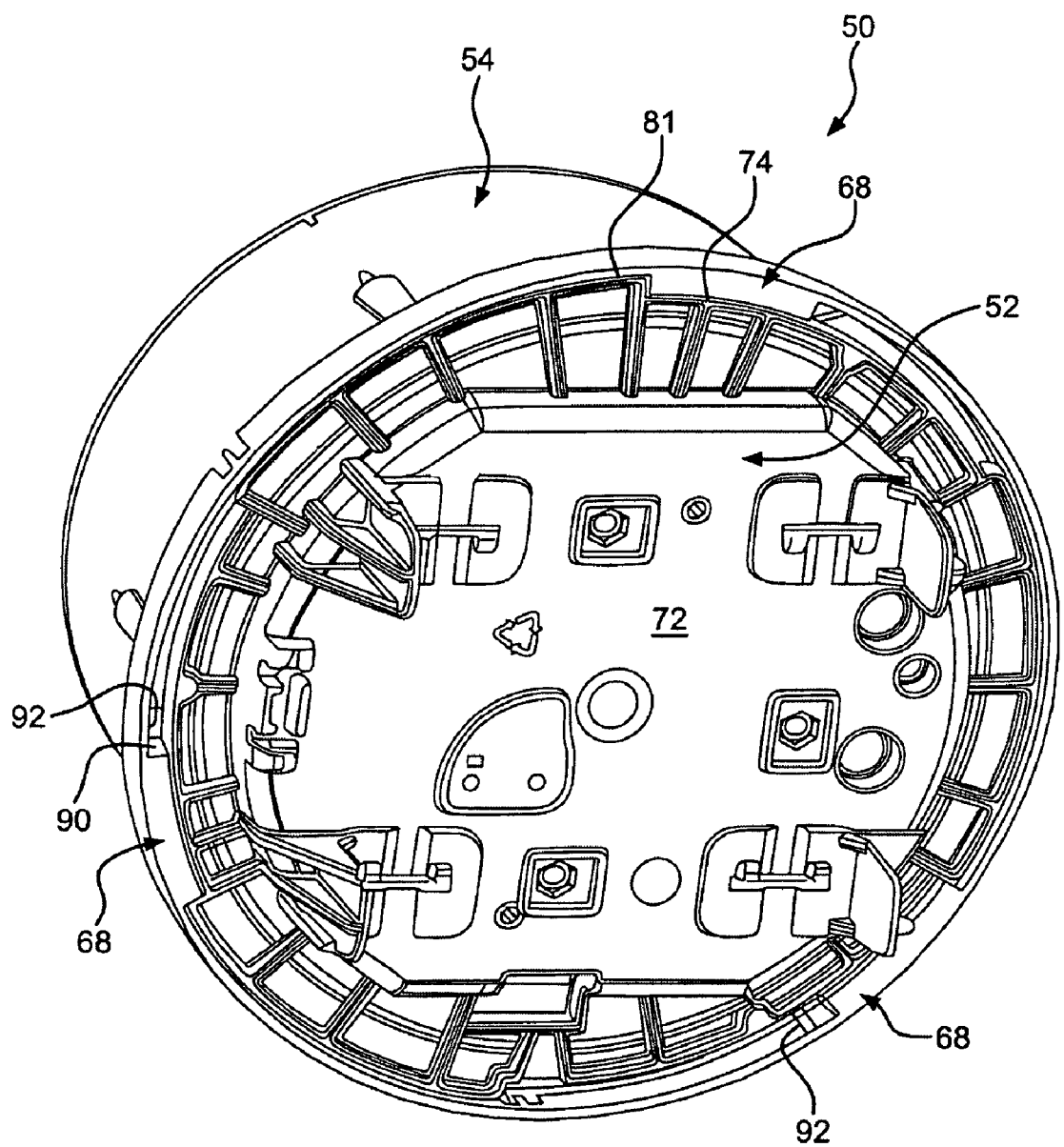
FIG. 5 is a rear perspective view of the electrical meter assembly illustrated in FIG. 4, wherein the meter cover is in an installed configuration.

Referring to FIGS. 3-5, an electrical energy meter assembly 50 can include a meter cover 54 configured to attach to a meter base 52. The meter assembly 50 can contain or support an electrical energy meter, such as an electrical watt-hour meter.

Referring in particular to FIG. 3, the illustrated meter cover 54 includes a substantially cylindrical body 56 extending axially along an axial axis A-A, and further extending radially about axis A-A. The cylindrical body defines a first, or axially inner, open end 58 and a second, or axially outer, closed end 60. The body 56 and closed outer end 60 define an internal void 62 configured to receive the inner workings (not shown) of an electrical energy meter. The closure at the outer end 60 of the body 56 can be transparent, semitransparent, or include one or more portions that can be transparent or semitransparent.

It should be appreciated that the terms "axially" and "radially" are used herein to describe directions relative to axis A-A. Accordingly, a radially inward direction refers to a direction toward axis A-A, while a radially outward direction refers to a direction away from axis A-A. Likewise, an axially outer direction refers to a direction from the axially inner end 58 of the cover towards the axially outer end 60 of the cover 54. An axially inner direction refers to a direction from the axially outer end 60 of the cover 54 toward the axially inner end 58 of the cover 54.

The cover 54 can include a radial flange 64 that projects radially out from, and extends circumferentially about, the first end 58 of the cover body 56. Thus, the flange can define a radially inner end that can be integrally connected to the first end 58 of the cover body 56, and an opposing radially outer end, or perimeter. An axial cover lip 66 can extend axially inward from the radially outer end of the flange 64. Thus, the cover lip 66 can define an axially outer end that is connected to the radially outer end of the flange, and an opposing axially inner end. The cover lip 66 is sized to fit over the meter base 52, and thus the outer diameter of the cover lip 66 can define the footprint of the cover 54.

Figure 6:
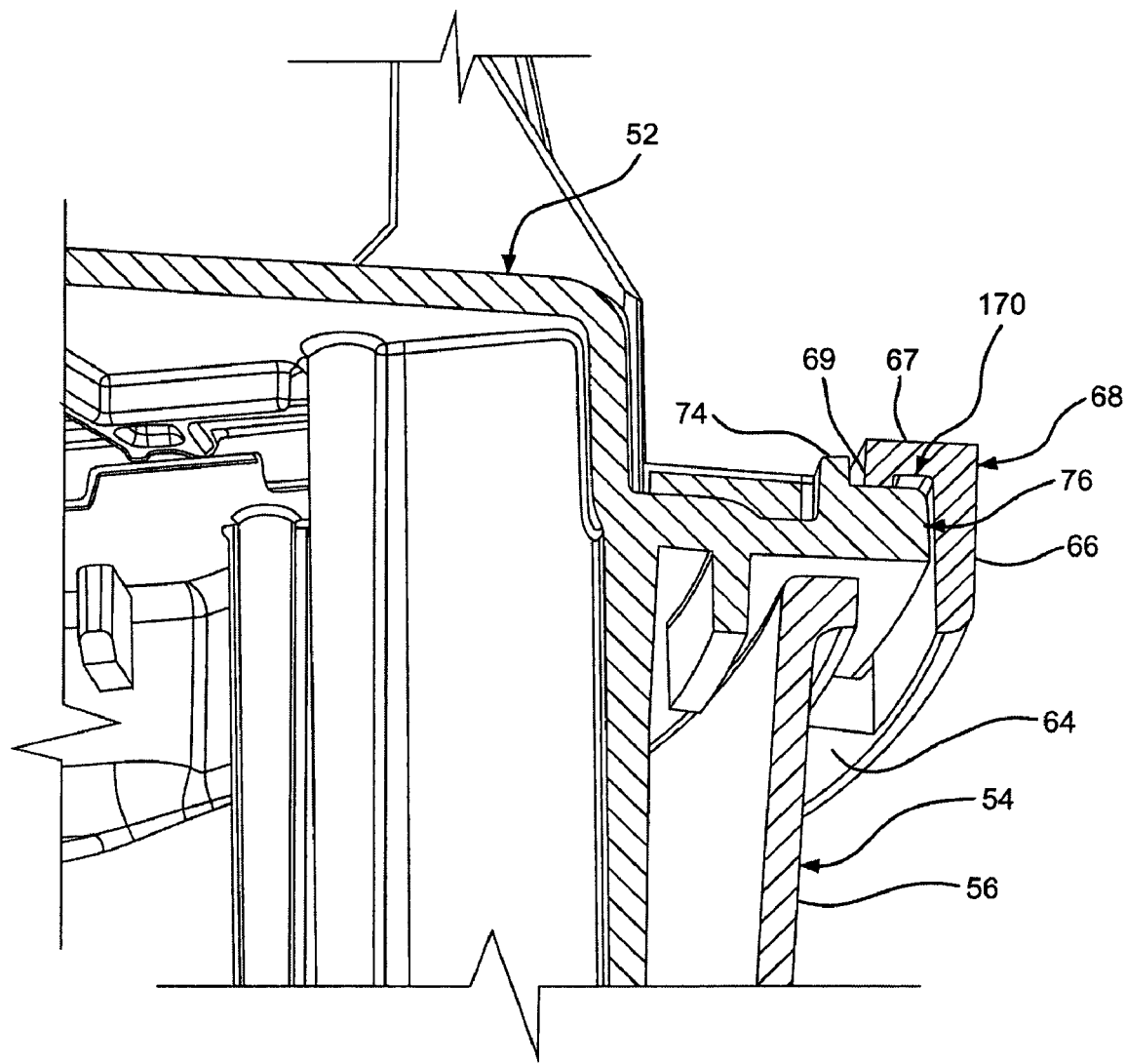
FIG. 6 is a section view taken through a portion of the electrical meter assembly illustrated in FIG. 5.

A plurality of retention lugs 68 can each be provided in the form of a radial plate 67 that projects radially inward from the axially inner end of the lip 66. Thus, the plate 67 can define a radially outer end that is integrally connected to the axially inner end of the lip 66, and an opposing radially inner end. As shown in FIG. 6, the retention lug 68 can further include an axial rim 69 that projects axially outward from the radially inner end of the plate 67 toward the flange 64. In this regard, it should be appreciated that the plate 67 can have a radial width that is less than that of the flange 64. Each retention lug 68 can be circumferentially elongate, and equidistantly spaced about the lip 66. The cover 54 includes a retention pocket 70 disposed between the axially inner surface of the retention lug 68 and the axially outer surface of the flange 64. The retention pocket 70 can define a closed radially outer end defined by the lip 66. The pocket 70 can further be defined by the axial rim 69.

The retention lugs 68, including the retention pocket 70, defines a proximal end 71 and an opposing distal end 73. The distal end 73 is radially spaced from the proximal end 71 in a clockwise direction when viewing the cover 54 from the open end 58. As will become apparent from the description below, the proximal end 71 defines an insertion end that initially receives a leading edge of locking structure from the base 52 as the cover 54 is rotated onto the base 52, and the leading end of the locking structure of the base 52 travels through the pocket 70 as the cover 54 is further rotated onto the base 52 until the leading end of the locking member is disposed proximate to the distal end, at which point the cover 54 is secured onto the base 52. As illustrated, three retention lugs 68 are illustrated and are spaced approximately 120° from each other.

Referring now to FIG. 4, the meter base 52 can include a substantially cylindrical base body 72 that defines a peripheral lip 74 sized to terminate radially inward from the retention lugs 68. The lip 74 also defines a height (or axial thickness) greater that of the retention pocket 70 such that the lip 74 interferes with the retention lugs 68, thus preventing the lip 74 from being inserted into the pocket 70 and ensuring proper radial alignment between the base 52 and cover 54. The base 52 further includes a plurality of locking members 76 corresponding to the plurality of retention pockets 70. Each locking member 76 can project radially out from the lip 74, and can be circumferentially elongate and arc-shaped. The locking members 76 can be equidistantly circumferentially spaced about the lip 74. Each locking member 76 can define a leading edge 78 and a trailing edge 80 that is axially thicker than the leading edge 78 so that the locking member 76 is sloped with respect to the horizontal. A stop plate 81 (see FIG. 5) can project axially in from the locking member 76 at a location proximate to the trailing edge 80.

Accordingly, during operation, the meter cover 54 can be mounted onto the base 52 such that the cover lip 66 circumscribes the base 52, and the locking members 76 are radially and axially aligned with the retention pockets 70. Next, the meter cover 54 can be rotated relative to the meter base 52 in the direction of Arrow B (see FIG. 4), which causes the leading edge 78 of the locking member 76 to enter the proximal end 71 of the corresponding pocket 70. The increasing thickness or slope of the locking member 76 in a direction from the leading edge 78 to the trailing edge 80 causes the locking members to provide a pressure-fit with the retention lug 68 as the cover 54 is rotated until the stop plate 81 engages the retention lug 68, at which point the cover 54 has been fully attached or secured to the base 52 as illustrated in FIG. 5.

Standards issued by the American National Standards Institute (ANSI) limit the size of the footprint of electrical meters. As a result, the covers of electrical meters have lips such as lip 66 that are relatively low radial thickness to ensure that the meter defines a footprint that is sized in compliance with the ANSI standards. The present disclosure recognizes that the low radial thickness of the lips can cause the lip to have a flexibility that could subject the meter to potential tampering in the manner described above.

For instance, lips such as the lip 66 could be flexed radially outward and away from the base 52, thereby translating the retention lug 68 radially outward and out of axial alignment with the corresponding locking member 76. Once the retention lug 68 is out of alignment with the locking member 76, the cover 54 could be simply pulled off the base 52. One envisioned method of flexing the lip 66 could include inserting a tool into the pocket 70 between the lip 66 and the proximal the trailing edge 80 of the locking member 76, and prying the lip 66 away form the locking member 76. It should thus be appreciated that the anticipated tampering could occur without involving relative rotation of the cover 54 and base 52.

Accordingly, embodiments described herein can include a retention rib 90 that can be juxtaposed with the distal end 73 of the pocket 70. In particular, the retention rib 90 can be attached to the distal end 73 of each retention lug 68, including the plate 67, the rim 69, or both. Thus, the retention rib 90 can extend axially outward from the plate 67, the rim 69, or both. Furthermore, the retention rib 90 can define a radial distance substantially equal to that of the plate 67, such that the rib 90 is connected between the radially inner and radially outer ends of the plate 67. The retention rib 90 can be rectangular as illustrated, or can comprise any suitable alternative geometric shape, such as triangular, square, and the like. In one embodiment, the retention rib 90 is further attached to, and extends axially inward from, the axially inner surface of the flange 64. In another embodiment, the retention rib 90 is further attached to, and extends radially inward from, the radially inner surface of the lip 66. The rib 90 can be discretely attached using any suitable fastener to the cover 54 known to one skilled in the art, or the rib 90 can be integrally formed (e.g., molded) with the cover 54.

Alternatively, the rib 90 could be attached to the cover 54 at a location adjacent to but spaced from any of the above-identified structure to which the rib 90 is described as being connected to so long as the rib 90 sufficiently limits or blocks access to the pocket 70 using a tool that could pry the cover 54 off the base 52. For instance, the rib could be disposed adjacent and radially spaced from the lug 68 a distance deemed insufficient to enable a tool to pry the cover 54 from the base 52. In one embodiment, rib 90 is radially spaced from the plate 67 a distance is less than the radial thickness of the rib 90, which includes the illustrated embodiment whereby the rib 90 is connected to the plate 67. While each retention lug 68 is provided with an associated rib 90 in accordance with one embodiment, it should be appreciated that certain other embodiments can include at least one rib 90 associated with a corresponding retention lug 68.

Because the rib 90 can mechanically join the flange 64 to the lip 66, the rib 90 provides greater radial strength to the lip 66 and reduces the likelihood that the lip 66 will be biased radially out from the base 52 in response to an applied force. Furthermore, the rib 90 can further prevent a tool from being inserted into the distal end of the retention pocket 70. Furthermore, because the retention rib 90 can be disposed at the distal end 73 of the retention lug 68, the retention rib 90 can engage the leading edge 78 of the locking member 76, and thus provide a stop with respect to further cover rotation once the leading edge 78 of the locking member 76 has contacted the retention rib 90. In this regard, it should be appreciated that the retention rib 90 can close or substantially close the distal end 73 of the retention pocket 70.

The cover 54 can further include a strengthening member in the form of a gusset 92 disposed between retention pockets 70. The strengthening gusset 92 can be disposed between each retention pocket 70, though it should be appreciated that more than one gusset 92 could be disposed between each retention pocket. Alternatively, a gusset 92 could be provided between only a select number of retention pockets 70 less than all retention pockets 70. The gusset 92 can be discretely attached to the cover 54 using any suitable fastener known to one skilled in the art, or the gusset 92 can be integrally formed (e.g., molded) with the cover 54.

Each strengthening gusset 92 can be attached to the axially inner surface of flange 64, and can be further attached to the radially inner surface of the lip 66. The gusset 92 can be triangular as illustrated, or could comprise any suitable alternative geometric shape, such as square, rectangular, and the like. Because the strengthening gusset 92 mechanically attaches the flange 64 to the lip 66, the gusset 92 provides greater radial strength to the lip 66 and reduces the likelihood that the lip 66 will be biased radially out from the base 52 in response to an applied force without causing the cover body 5 to crack, which would indicate a tampering event.

Figure 7:
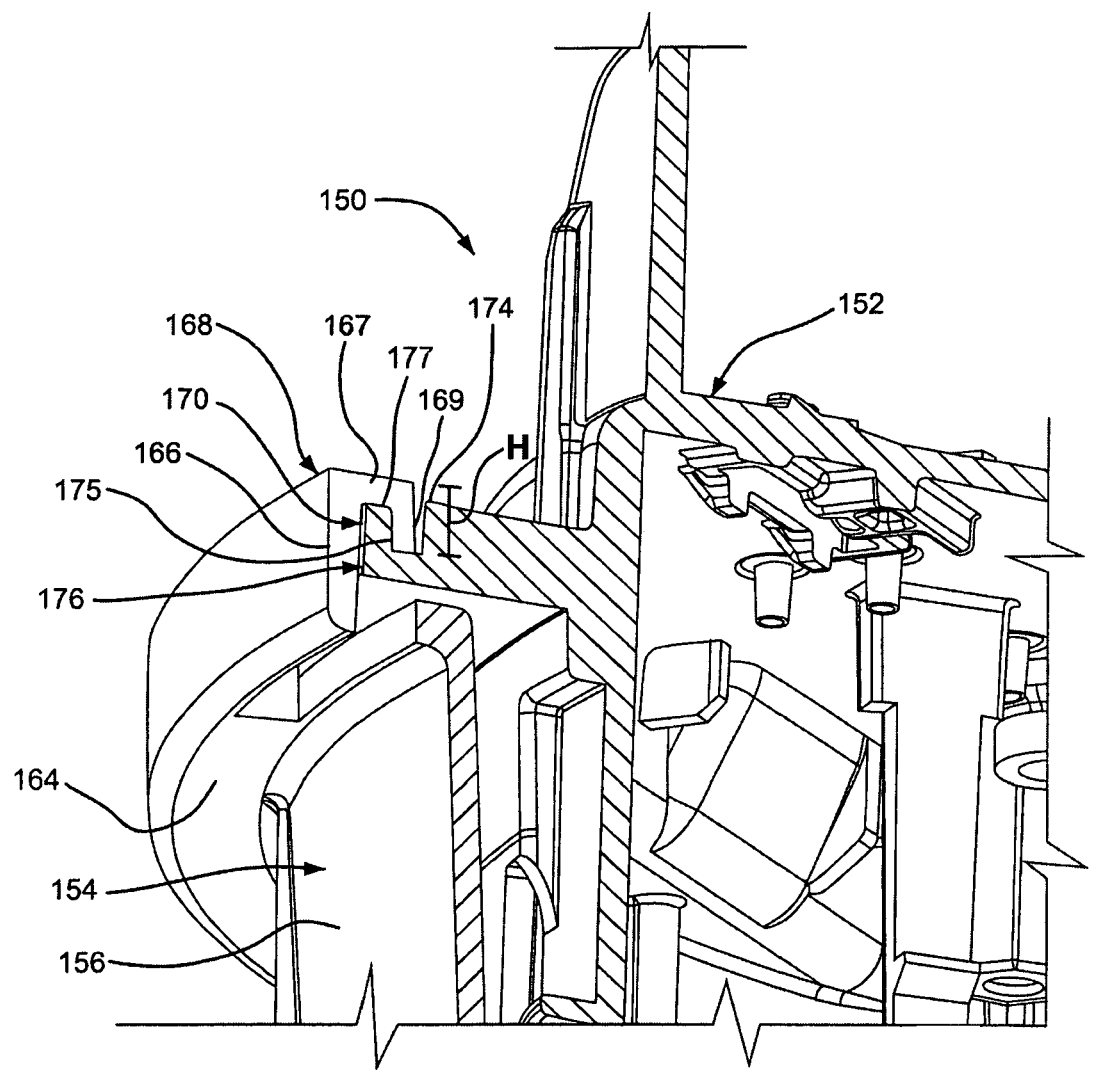
FIG. 7 is a section view similar to FIG. 6, but showing a meter assembly including a meter base and a meter cover both constructed in accordance with an alternative embodiment.
Figure 8:
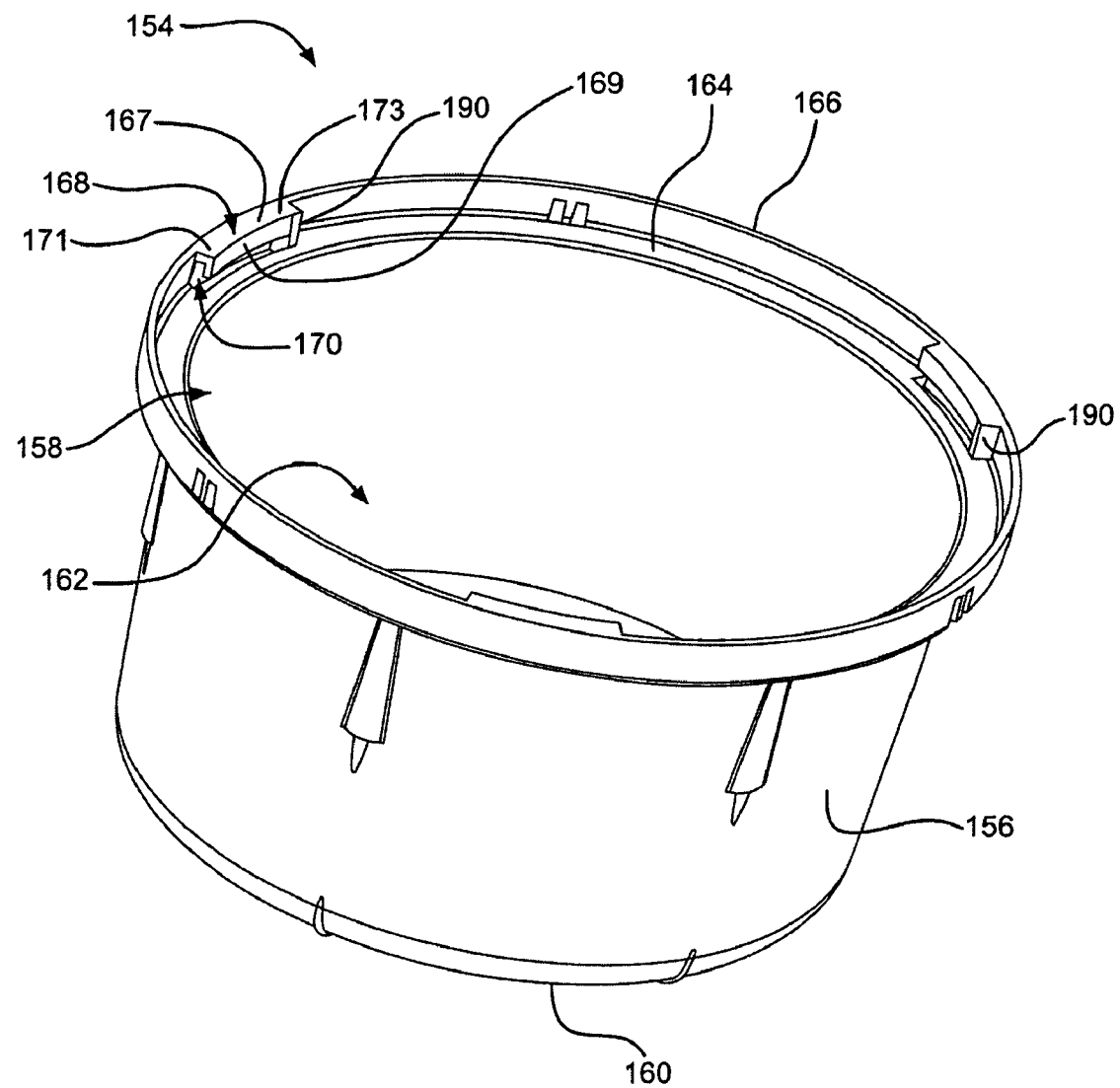
FIG. 8 is a perspective view of the meter cover illustrated in FIG. 7.
Figure 9:
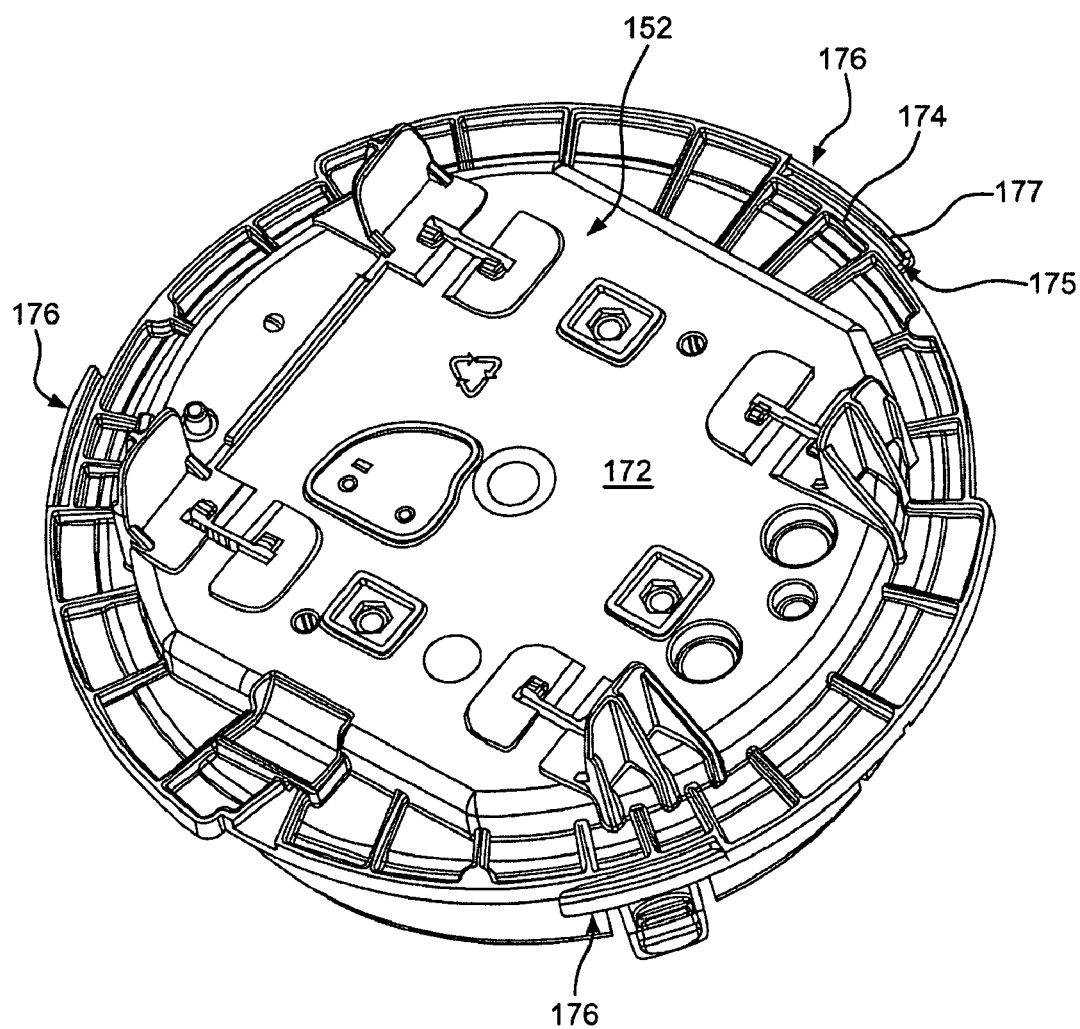
FIG. 9 is a rear perspective view of the base illustrated in FIG. 7.

Referring now to FIGS. 7-9, a meter assembly 150 constructed in accordance with an alternative embodiment is illustrated having reference numerals corresponding to like elements of meter assembly 50 incremented by 100 for the purposes of clarity and illustration. For instance, one or more, including all, retention lugs 168 can include a rim 169 that extends further axially outward from the plate 167 than the rim 69 extends out from the plate 67. In one embodiment, the rim 169 can extend axially out from the axially inner edge of plate 167 to define a height "H" (see FIG. 7) that is greater than 0.105 inch and less than or substantially equal to 0.190 inch.

The base 152 can include a groove 175 that projects axially outward into one or more, including all, of the locking members 176 to define an axial retention flange 177 that is radially spaced from the peripheral lip 174. The groove 175 has a radial thickness and axial depth sized to receive the rim 169 of retention lug 168. The retention flange likewise 177 has a radial thickness and axial height configured to fit within the retention pocket 170. The groove 175 can extend substantially horizontally, or can be sloped in the axial direction as described above with respect to locking member 76.

It should thus be appreciated that the rim 169 is radially aligned with the retention flange 177, and thus interferes or interlocks with the retention flange 177 to prevent the lip 166 from being flexed radially outward, which could translate the retention lug 168 radially outward and out of axial alignment with the corresponding locking member 176. Accordingly, in order to remove the meter cover 154 from the base 152, substantial breakage to various components of the meter assembly 150 would occur, thus providing visual evidence of tampering. Accordingly, the meter assembly 150 can be said to be tamper resistant, and can also be said to be tamper evident.

Referring to FIG. 8 in particular, the meter cover 154 can include the strengthening and retention features of cover 54. For instance, meter cover 154 can include retention ribs 90 that can be attached to the distal end 173 of each retention lug 168, including the plate 167, the rim 169, or both. Likewise, the cover 154 can include strengthening members if desired, such as strengthening members 92 illustrated and described above with reference to FIG. 3.

Figure 10:
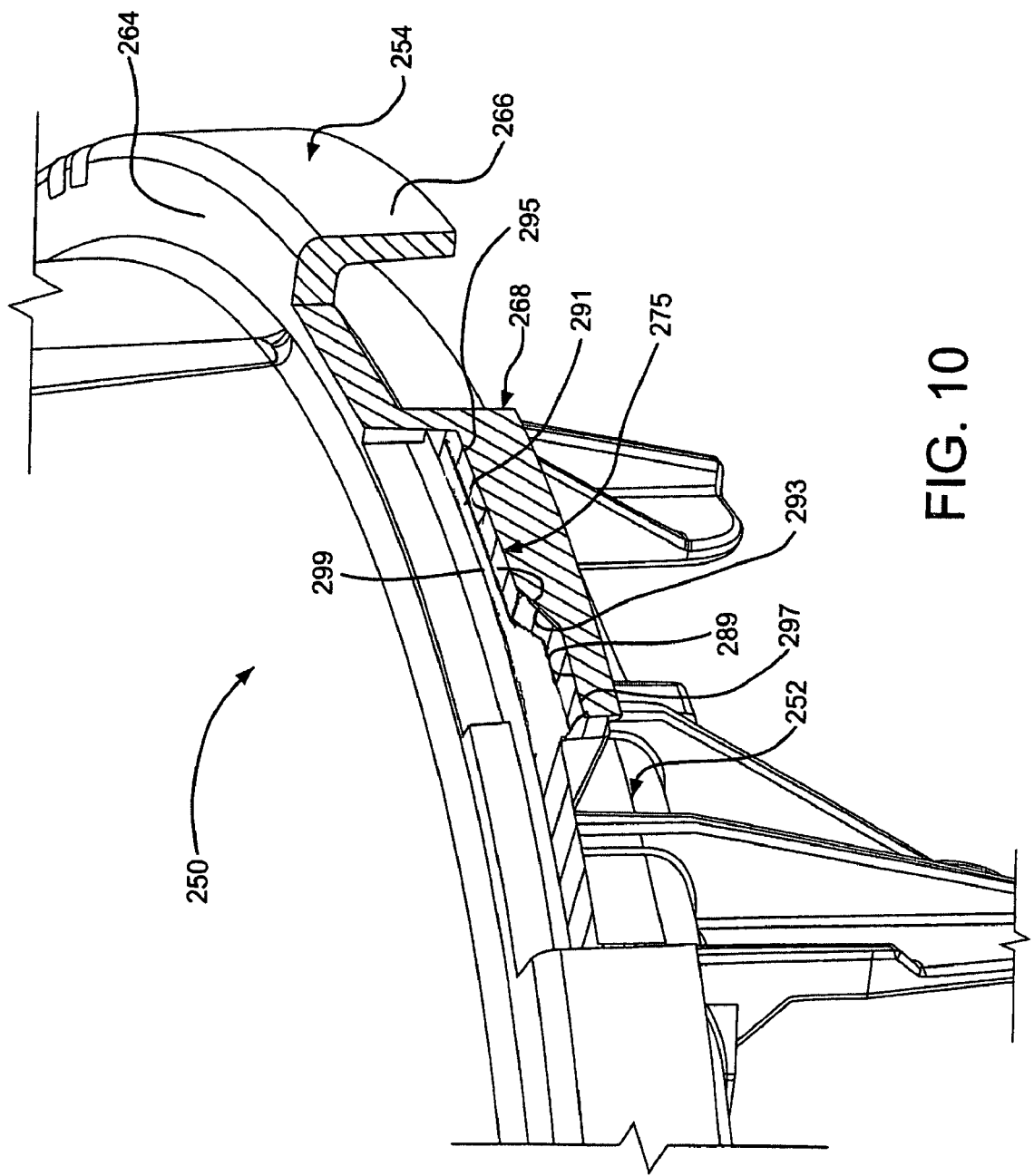
FIG. 10 is a partial perspective view of a meter assembly including a meter base and a meter cover, both constructed in accordance with yet another alternative embodiment.
Figure 11:
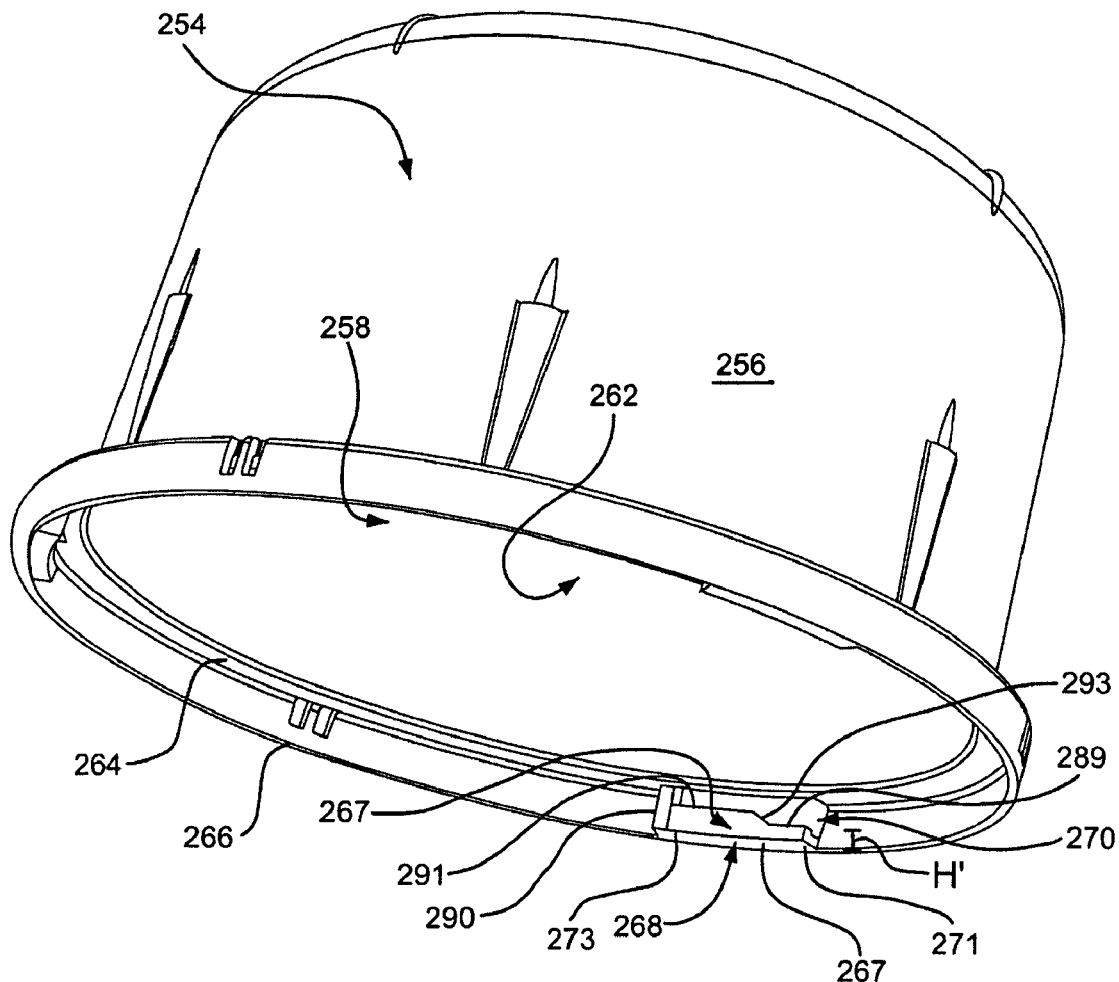
FIG. 11 is a perspective view of meter the cover illustrated in FIG. 10.
Figure 12:
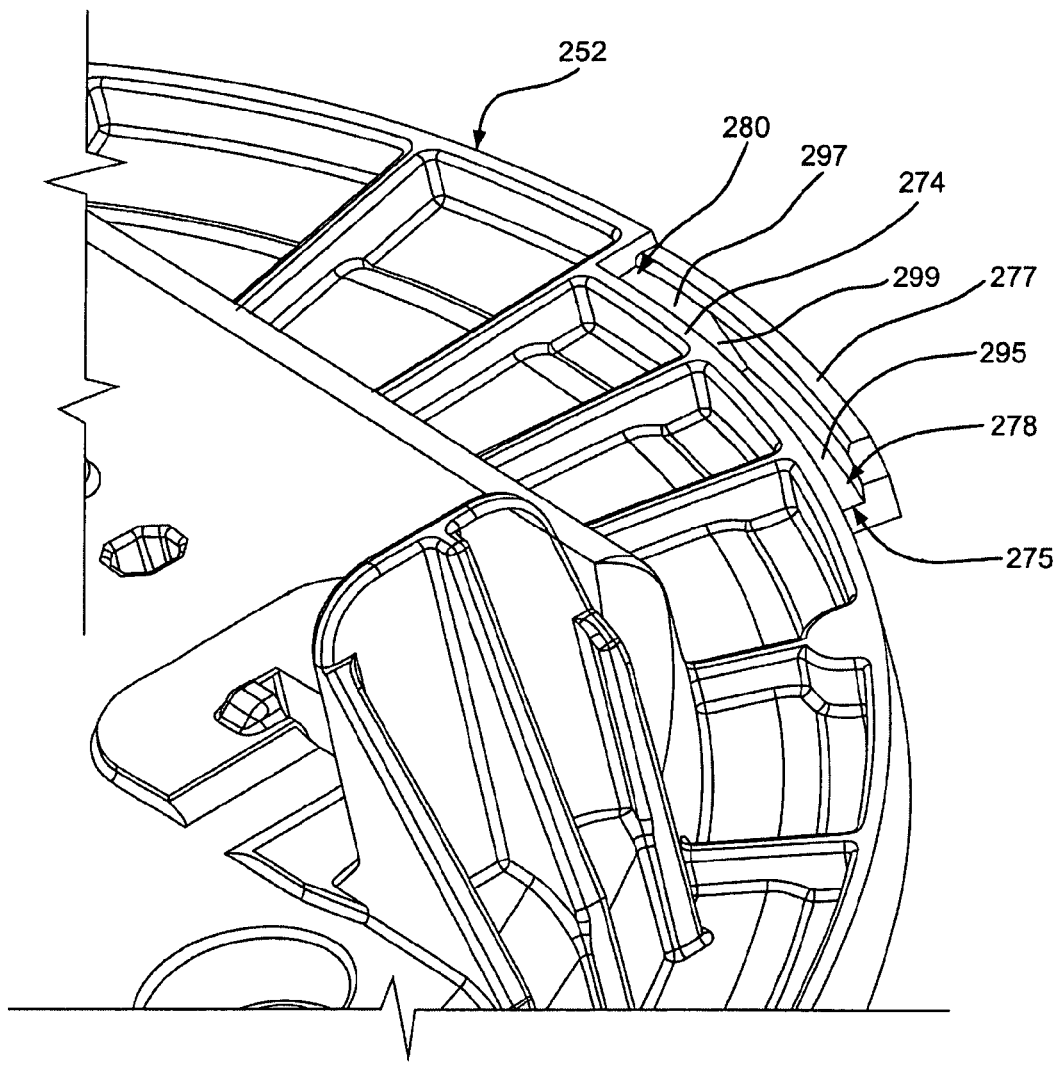
FIG. 12 is a partial perspective view of the base illustrated in FIG. 10.

Referring now to FIGS. 10-12, a meter assembly 250 constructed in accordance with an alternative embodiment is illustrated having reference numerals corresponding to like elements of meter assembly 150 incremented by 100 for the purposes of clarity and illustration. The meter assembly 250 includes a base 252 and a cover 254 that can engage in the manner described above with respect to FIGS. 7-9. Additionally, the base 252 can attach to conventional meter covers and the cover 254 can attach to conventional meter bases.

For instance, one or more, including all, retention lugs 268 of the cover 254 can include a stepped rim 269 that includes a lower shelf 289, an upper shelf 291, and an angled transition portion 293 that joins the lower shelf 289 to the upper shelf 291. The upper shelf 291 is thus disposed axially outward with respect to the lower shelf 289. The proximal end 271 of the lower shelf 289 can define the proximal end of the retention pocket 270. The distal end 273 of the upper shelf 291 can define the distal end of the retention pocket 270.

Figure 1:
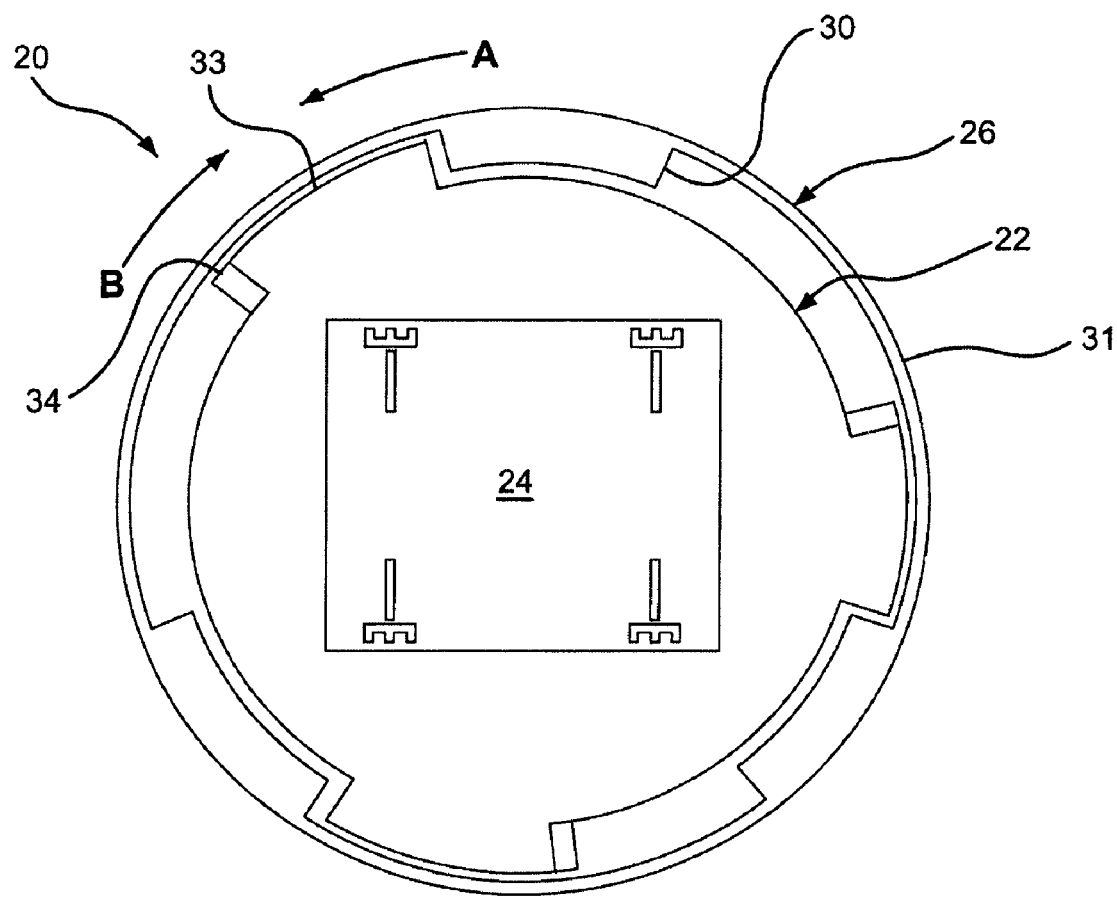
FIG. 1 is a bottom plan view of an electrical meter assembly including a base and a cover constructed in accordance with the prior art.
Figure 2:
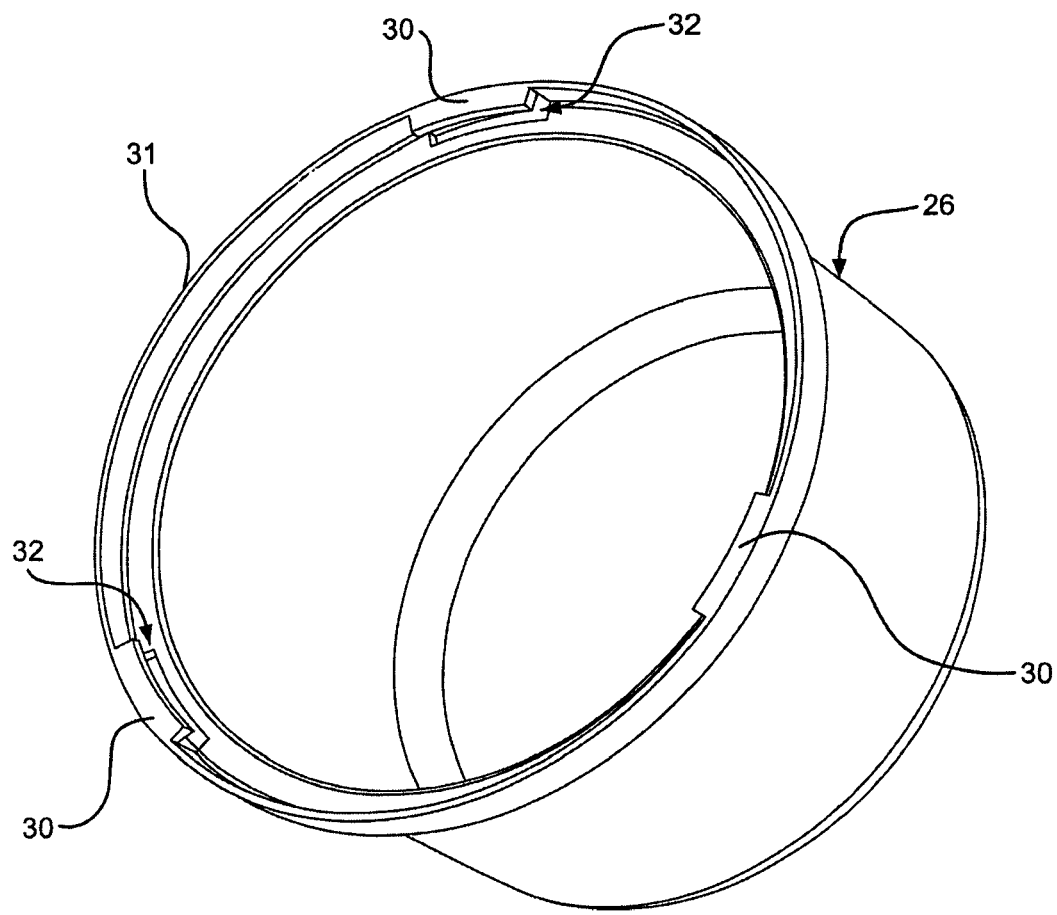
FIG. 2 is a rear perspective view of the cover illustrated in FIG. 1.

The lower shelf 289 can be configured to receive a retention lug of a conventional meter base, for instance lug 30 illustrated in FIG. 1. Accordingly, the lower shelf 289 can define a circumferential length that can be greater than, less than, or substantially equal to the conventional lug 30, and can define a height configured to engage the axially inner surface of the conventional lug. In one embodiment, the lower shelf 289 can have a height H' substantially equal to 0.105 inch, and can have a circumferential length substantially equal to 0.625 inch. The retention lugs 268 of the cover 254 are also configured to mate with the base 252 having a stepped groove 275 as described below.

The upper shelf 291 can be configured as described above with respect to rim 169, and can thus define a height that is greater than 0.105 inch and less than or substantially equal to 0.190 inch. The upper shelf 291 can have a circumferential length substantially equal to 0.625 inch. The transition portion 293 can be angled and thus extend circumferentially and axially outward from the lower shelf 289 to the upper shelf 291. The transition portion 293 can thus have a height substantially equal to 0.085 inches, which can thus be the difference in height between the upper shelf 291 and the lower shelf 289. The transition portion 293 can thus provide a stop configured to abut the conventional lug that is inserted into the retention pocket 270.

Referring to FIG. 11 in particular, the meter cover 254 can include the strengthening and retention features of cover 54. For instance, meter cover 254 can include retention ribs 90 that can be attached to the distal end 273 of each retention lug 268, including the plate 267, the rim 269, or both. Likewise, the cover 154 can include strengthening members if desired, such as strengthening members 92 illustrated and described above with reference to FIG. 3.

Referring now to FIGS. 10 and 12, the base 252 can likewise include a stepped groove 275 having a leading end 278 and a trailing end 280. The stepped groove 272 can include an axially deep groove portion 295, an axially shallow groove portion 297, and a transition portion 299 joining the deep groove portion 295 to the shallow groove portion 297. Thus it should be appreciated that the axially deep groove portion 295 is axially offset with respect to the axially shallow groove portion 297 such that the shallow groove portion 297 is disposed axially outward with respect to the deep groove portion 295. The axially shallow groove portion 297 is disposed proximate to the trailing end 280 of the groove 275, while the axially deep groove portion 295 is disposed proximate to the leading end 278 of the groove 275.

The deep groove portion 295 can have a circumferential length substantially equal to, less than, or greater than that of the upper shelf 291, and can have a depth with respect to the axially inner horizontal edge of the retention flange 277 substantially equal to the height of the upper shelf 291 such that the upper shelf 291 is tightly received in the deep groove portion 295 when the cover 254 is attached to the base 252. Likewise, the shallow groove portion 297 can have a circumferential length substantially equal to, less than, or greater than that of the upper shelf lower shelf 289, and can have a depth with respect to the axially inner horizontal edge of the retention flange 277 substantially equal to the height of the lower shelf 289 such that the lower shelf 289 is tightly received in the shallow groove portion 297 when the cover 254 is attached to the base 252. It should be appreciated that both groove portions 295 and 297 can be sloped in the manner described above to provide a tight fit with the cover 254.

The transition portion 299 can be angled and thus extend circumferentially and axially inward from the deep groove portion 295 to the shallow groove portion 297. The transition portion 299 can thus provide a stop configured to abut the transition portion 293 of the cover 254 when the cover 254 is attached to the base 252.

It should be appreciated that both stepped portions of the rim 269 are radially aligned with the retention flange 277, and thus interfere or interlock with the retention flange 277 to prevent the lip 266 from being flexed radially outward, which could translate the retention lug 268 radially outward and out of axial alignment with the corresponding locking member 276. Accordingly, in order to remove the meter cover 254 from the base 252, substantial breakage to various components of the meter assembly 250 would occur, thus providing visual evidence of tampering. Accordingly, the meter assembly 250 can be said to be tamper resistant, and can also be said to be tamper evident.

The shallow groove portion 297 can have a depth substantially equal to conventional retention lugs of meter covers, such as retention lug 30. Accordingly, the base 252 is configured for attachment with conventional meter covers, such as cover 26, or meter covers having conventional retention lugs but also provided with tamper resistant or tamper evident structure, such as the retention rib 90 and gussets 92 in the manner described above. When the base 252 attaches to a conventional cover, the retention lug is spaced axially from the deep groove portion 295, but engages the shallow groove portion 297 when the base 252 and conventional cover are fully connected. In this regard, it should be appreciated that the shallow groove portion 297 can define any suitable circumferential length to adequately engage the corresponding retention lug. Thus, the base 252 is configured to interlock with a plurality of meter covers such as meter cover 26 meter cover 54, meter cover 154, and meter cover 254. Likewise, the meter cover 254 is configured to interlock with a meter base such as base 52, 152, and 252.

The foregoing description is provided for the purpose of explanation and is not to be construed as limiting the scope of the claims. While preferred embodiments have been described, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the present invention as defined by the appended claims.

What is claimed:

1. An electrical meter cover configured to be mounted onto an electrical meter base of the type defining a substantially cylindrical body, and a locking member carried by the cylindrical body, the electrical meter cover body comprising:
   a substantially cylindrical cover body defining a closed axially outer end, and an opposing open axially inner end;
   a flange extending radially outward from the axially inner end of the cover body;
   a lip extending axially inward from the flange;
   a retention lug defining a retention pocket that is configured to receive the locking member of the meter cover to secure the meter cover onto the meter base, wherein the pocket defines a proximal insertion end and an opposing distal end; and
   a retention rib disposed outside the pocket and juxtaposed with the distal end of the pocket so as to limit access to the pocket once the meter cover has been secured onto the meter base.

2. The electrical meter cover as recited in claim 1, wherein the retention rib has a radial thickness, and the retention rib is spaced from the distal end of the pocket a distance less than the radial thickness of the retention rib.

3. The electrical meter cover as recited in claim 1, wherein the retention rib is connected to the retention lug.

4. The electrical meter cover as recited in claim 3, wherein the retention lug further comprises:
   a plate extending radially inward from the lip; and
   a rim projecting axially outward from the plate at a location radially inward with respect to the lip,
   wherein the retention rib is connected to the plate.

5. The electrical meter cover as recited in claim 4, wherein the retention rib is connected between the flange and the plate.

6. The electrical meter cover as recited in claim 4, wherein the retention rib is further connected to the rim.

7. The electrical meter cover as recited in claim 4, wherein the rim defines an axially outer free end that is spaced from an axially inner surface of the plate by a distance that is greater than 0.105 inch and less than or substantially equal to 0.190 inch.

8. The electrical meter cover as recited in claim 4, wherein the rim defines a first shelf and a second shelf spaced circumferentially from the first shelf and axially offset with respect to the first shelf.

9. The electrical meter cover as recited in claim 8, further comprising an angled transition portion connected between the first and second shelves.

10. The electrical meter cover as recited in claim 1, further comprising at least one strengthening gusset connected between the lip and the flange at a location such that the retention rib is disposed between the retention lug and the strengthening gusset.

11. An electrical meter base for connection with a meter cover of the type defining a retention pocket configured for securement onto the meter base, the meter base comprising:
   a substantially cylindrical base body defining a radially outer end;
   a peripheral lip disposed at the radially outer end of the base body;
   an arc-shaped locking member projecting radially out from the lip;
   a retention flange extending axially out from the locking member so as to define a groove between the retention flange and the peripheral lip,
   wherein the retention flange is configured to be received in a the retention pocket of the meter cover.

12. The electrical meter base as recited in claim 11, wherein the groove is stepped so as to define an axially deep groove portion and an axially shallow groove portion that is axially offset from the axially deep groove portion.

13. The electrical meter base as recited in claim 12, wherein the axially shallow groove portion is disposed proximate to a trailing end of the groove, and the axially deep groove portion is disposed proximate to a leading end of the groove.

14. The electrical meter base as recited in claim 12, further comprising an angled transition portion connected between the axially deep groove portion and the axially shallow groove portion.

15. An electrical meter assembly comprising:
   an electrical meter base including:
      a substantially cylindrical base body defining a radially outer end;
      a peripheral lip disposed at the radially outer end of the base body;
      a locking member projecting radially out from the lip; and
      a retention flange extending axially out from the locking member so as to define a groove between the retention flange and the peripheral lip, wherein the groove is stepped so as to define an axially deep groove portion and an axially shallow groove portion that is axially offset from the axially deep groove portion; and
   an electrical meter cover configured to be secured onto the electrical meter base, the electrical meter cover including:
      a substantially cylindrical cover body defining an axially outer closed end, and an opposing axially inner open end;
      a radial flange defining a radially inner end connected to the open and of the cover body, and an opposing radially outer end;
      a lip extending axially inward from the radially outer end of the flange; and
      a retention lug including 1) a plate having a radially outer end that is connected to the axially inner end of the lip, and an opposing radially inner end, wherein the plate and the radial flange define a retention pocket therebetween, and 2) a rim projecting axially outward from the radially inner end of the plate, wherein the rim is configured to engage the shallow groove portion to secure the meter cover onto the meter base.

16. The electrical meter assembly as recited in claim 15, wherein the rim defines an upper shelf and a lower shelf, the upper shelf is disposed axially outward with respect to the lower shelf, and the lower shelf is configured to engage the shallow groove portion and the upper shelf is configured to engage the deep groove portion.

17. The electrical meter assembly as recited in claim 16, wherein the rim defines an angled transition portion connected between the upper shelf and the lower shelf.

18. The electrical meter assembly as recited in claim 16, wherein the cover further comprises a retention rib disposed outside the pocket and connected between the plate and the flange so as to limit access to the pocket when the cover is secured onto the base.

19. The electrical meter assembly as recited in claim 16, further comprising at least one strengthening gusset connected between the lip and the flange at a location spaced from the retention lug.

\* \* \* \* \*